United States Patent
Kay et al.

(10) Patent No.: US 6,462,436 B1
(45) Date of Patent: Oct. 8, 2002

(54) ECONOMICAL PACKAGING FOR EMI SHIELDS ON PCB

(75) Inventors: Jason A. Kay, Morristown; David Stevens Kerr, Morris Plains; John Robert Morris, Jr., Cranbury, all of NJ (US); Ivan Pawlenko, Holland, PA (US); Richard Franklin Schwartz, Cranbury, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/373,942

(22) Filed: Aug. 13, 1999

(51) Int. Cl.[7] ............................................. H04B 15/00
(52) U.S. Cl. .................................... 307/91; 361/818
(58) Field of Search .................... 307/89, 91; 361/818; 257/659

(56) References Cited

U.S. PATENT DOCUMENTS

| | | | |
|---|---|---|---|
| 4,743,715 A | 5/1988 | Gaillard et al. | ........... 200/50 A |
| 5,428,508 A | * 6/1995 | Pronto | ........................ 361/818 |
| 5,633,786 A | * 5/1997 | Matuszewski et al. | ...... 361/818 |
| 5,837,949 A | 11/1998 | Green et al. | ............. 200/50.21 |

* cited by examiner

Primary Examiner—Josie Ballato
Assistant Examiner—Robert L Deberadinis

(57) ABSTRACT

An economical protective shield assembly of a dielectric substrate and an EMI shield, substantially free of the effects of board coupling and air coupling which requires less hardware for securing an EMI shield than present devices and methods, is provided for. The inventions use of simply finished shield edges with an unimproved substrate having a conductive intermediary interconnected with a grounding path and simply finished or unfinished shield edges with an improved substrate having a mating groove cooperatively adapted to fit the shield edge, interacts to exclude EMI signals and requires less precision in positioning the shield onto the substrate. The invention also provides a simplified method to exclude EMI effects for an assembly by a process of fabrication requiring less finishing steps than present processes.

26 Claims, 4 Drawing Sheets

ECONOMICAL PACKAGING FOR EMI SHIELDS ON PCB

BACKGROUND OF THE INVENTION

1. Field of Invention

The present invention relates generally to protective enclosures for electronics and electronic circuits.

2. Description of the Prior Art

Electronic circuitry assemblies, printed circuits boards, and substrates containing circuitry and electronic components mounted thereon, often require electromagnetic interference (EMI) shields to limit the likelihood of signal interferences from electromagnetic waves, such as those caused by radio-frequency (RF) signals.

It is known that the operation and performance of sensitive electronic components, such as integrated circuits (ICs), can be affected by the presence of interfering electromagnetic signals. Certain electronic components and devices are known to emit electromagnetic signals during their operation. In particular, on a circuit board, components emitting EMI signals can detrimentally affect the performance, reliability and even operability of other electronic components on the same board. Three essential elements must be present for an EMI situation to exist, including: an electrical noise (EMI) source, a coupling path, and a victim receptor. The noise source emission can be either a conducted voltage or current, or an electric or magnetic field propagated through space. It is known that certain equipment and systems can serve as both EMI sources and receptors. A coupling path may exist between signal sources and receptors and can be divided into two basic groups: radiation or field coupling by electromagnetic wave propagation through space or materials (hereinafter known as "air coupling"), and coupling via conducted paths through which current can flow (hereinafter known as "board coupling"). Additionally, and herein after, the use of the term "board coupling" includes the transmission of EMI across a circuit as well as electromagnetic wave propagation through the circuit board or substrate material and the term "air coupling" includes the transmission of EMI through the air due to electric field and/or magnetic field emanations.

To minimize the presence of interfering signals with sensitive electronic components and the effects of air coupling and board coupling, whether the interfering source is on the same assembly or apart from the receptor device being a sensitive electronic, the use of EMI shielding is often employed.

EMI signals may occur and interfere with electronic components due to sharing of conductors with EMI sources, emanation of electric fields, emanation of magnetic fields and electromagnetic radiation. EMI shielding causes an electromagnetic wave propagating through space to be absorbed or reflected when the wave contacts the shield wall. EMI signals are first reflected off a shield wall usually due to the material of the shield. EMI signals, also known as energy, which are not completely reflected may then be absorbed by the shield wall such that only residual energy is able to emerge from the opposing side of the shield wall. The emergent residual energy is the resulting EMI. Therefore, the effectiveness of the shielding is determined by the shield's reflectance and absorbance characteristics, which are dependent on the shield material and the shield interface with the substrate and circuit ground.

EMI shields are often installed over or in proximity to sensitive electronic components on a circuit board to inhibit interference from propagating to a receptor or to prevent EMI signals from being emitted by an emitting source. An EMI shield may be of varying in shape and size in relation to the sensitivity of the electronics and the material used in construction of the EMI shield. Generally, EMI shields range in size from one square inch to over two square feet.

It is known that an EMI shield is typically comprised of a metal sheet, a casting, or other conductive material such as a mesh or paint which is formed into a shape in relation to both the components and the space available on the circuit board. An EMI shield is usually precisely placed on a circuit board at a prescribed location and is attempted to be grounded, usually with a circuit ground. The EMI shield is typically installed by securing the shield to the circuit board. Often, compression fittings or screws are used to secure the shield in place. However, in securing the shield, often shield edges move slightly from the prescribed location, thereby affecting shield performance. It is known that the precision placement of the shield in contact with the substrate and a ground is critical to effectively isolate the circuit from interference and effectively ground errant electromagnetic waves.

Problems frequently arise due to movement of the shield during securing and also due to gapping along the interface between the shield edge and circuit board. In particular, the surfaces of the standard boards and shield edges are not uniformly planar and these nonuniformities cause inconsistencies in contacts due to spaces or gaps resulting at the interface between a board and a mounted shield edge. Similar problems also arise when shield edges are improperly positioned by as little as 0.0001 inches from the predetermined location. Unfortunately, these problems usually cause EMI coupling, such as interferences due to common impedance (e.g. board coupling) and electric and magnetic fields (e.g. air coupling), resulting in EMI signals interfering with sensitive components.

Prior art solutions, in attempting to resolve these problems, have maintained the use of a shield edge having a surface which is finished flat, as conventional belief is that a flat edge limits the movement of the edge in relation the edge's position on the substrate. However, the prior art's use of a flat edge surface does not overcome problems resulting from movement, gapping or the effects of nonplanar surfaces. A flat edge surface does not substantially prevent EMI effects, and in particular, does not substantially limit EMI effects caused by air coupling. Consequently, the prior art has been less than satisfactory.

In FIG. 1, prior art EMI shields and substrates are depicted. FIGS. 1A through 1C depict shields which are to be secured onto a substrate at precise locations using a securing means, such as a plurality of screws (not pictured). Each of these prior art figures necessitates that the shield edge be precisely aligned with the predetermined location on the substrate, as previously discussed.

FIG. 1A depicts a conductive gasket 10 to be placed on a substrate 20 and a casted EMI shield 30 having a cut-out 40 fitted to receive the gasket 10. The gasket 10 is sandwiched into the cut-out 40 and the resulting shield 30 and gasket 10 are compressed onto the substrate 20 and secured by a securing means. FIG. 1B depicts a gasket 50, which forms in place on the planar contact surface 60 of the shield 65. When compressed into place, the gasket 50 also forms to take the shape of the surface 75 of the substrate 70. The gasket 50 is comprised of a deforming material, which alters its shape when compressed under pressure or at elevated temperature. A machine (not pictured) is typically used to form the gasket 50 in place along the edge 60 of the shield 65. The shield 65 and gasket 50 are then compressed into place on the surface 75 of the substrate 70 and secured by a securing means.

FIG. 1C depicts a non-contacting interface 80 between a substrate 90 and an edge 95 of a shield 99.

Each of the FIGS., 1A through 1C, shows a cross-sectional view when the substrate, the grounding means and the shield are each planar with respect to one another. In situations where these elements are not planar, the interface contact is interrupted or is inconsistent and the EMI reflectivity and absorbtivity of the shield at the interface is generally unsatisfactory. Additionally, each of the prior art depictions is generally ineffective in substantially preventing EMI due to board coupling and air coupling effects, since gaps at interfaces result in substantially reduced shielding performance.

Attempts have been made to improve the contact by using post-fabrication planar edges and boards. Following initial fabrication, edges of the EMI shields are finished flat to remove burrs and imperfections and usually the shield edge is planed flat. Similar steps during or subsequent to manufacture are made to improve board surfaces. These steps add considerable time and expense to the EMI shield and board, and often result in minimal shielding improvement. Further, attempts to improve the contact and performance of the shielding have also included providing additional screws in close relation to one another. The addition of screws to shield-board assembly results in limited improvements since variations in performance of the shield across the shielded area are common due to the variations of torque exerted on each screw. Minor deviations in torque on each screw detrimentally and significantly affects the overall performance of the shield, causing certain shielded areas to have better shielding than other. Further, the addition of screws to a mounted shield has also been used to attempt to reduce air coupling problems resulting from EMI signal propagation. However, these attempts have been generally unsatisfactory for similar reasons.

FIG. 2 is a diagrammatic view of an EMI shield 100, having a planar shield edge 105, mounted and secured to a substrate 110, at an interface 120, with a plurality of screws 130 for securing the shield 100 to the substrate 110.

Consequently, unless each of the screws is secured with approximately the same torque, and unless a planar shield edge is used with a planar circuit board, performance variations across the shield will likely exist and the chance of edge movement in relation to precision placement of the shield thereby increases. Additionally, with the increased number of screws, there is a proportional decrease in the space available for components. These detrimental factors increase costs of manufacture and labor time required to precision mount and adjust shielding devices in an attempt to obtain desired performances.

Accordingly, there exists a need to economically and consistently produce a solution utilizing standard circuit boards and EMI shields which requires minimal post-manufacturing fabrication and provides electrical isolation from electromagnetic interference due to board coupling and air coupling, while reducing the need for securing hardware.

The present invention provides a conductive connectivity between an EMI shield edge and a means capable of performing the function of grounding the shield with an infinite sink along the interface with the shield edge. The means is electrically configured to provide electrical interconnections between a ground sink and shield edges, which are fitted on an intermediary or the substrate, which is in electrical conductivity with the means. In a preferred embodiment, the edges are fitted into the intermediary. Further, and hereinafter, this means is referred to as the grounding means which includes the ability to provide a ground, a ground path, and a grounded intermediary, as well as electrical connectivity and conductivity to each. The grounding means also has the capability to provide connectivity to a ground having an infinite sink.

The present invention provides a simple EMI shielding assembly with a dielectric substrate, having at least one electronic component mounted thereon, in which simply finished angled EMI shield edges are adaptably and non-precisionly fitted and secured onto the substrate and remain in conductive contact with the grounding means, thereby substantially excluding EMI effects of board coupling and air coupling from shielded electronics.

The present invention also provides a simple EMI shielding assembly with a dielectric substrate, having at least one electronic component mounted thereon, in which simple unfinished rough EMI shield edges are adaptably and non-precisionly fitted and secured into an improved substrate having an angled mating groove extending below the substrate surface, in which EMI shield edges remain in conductive contact with the grounding means, thereby substantially excluding EMI effects of board coupling and air coupling from shielded electronics.

The present invention further provides a simple EMI shielding assembly with a dielectric substrate, having at least one electronic component mounted thereon, in which simply finished angled EMI shield edges are adaptably and non-precisionly fitted and secured into an improved substrate having an angled mating groove extending below the substrate surface, in which EMI shield edges remain in conductive contact with the grounding means, thereby substantially excluding EMI effects of board coupling and air coupling from shielded electronics.

Additionally, the present invention provides a method for fabricating an EMI shielding assembly with a dielectric substrate in which simply finished angled EMI shield edges are adaptably and non-precisionly fitted and secured into an improved substrate having an angled mating groove extending below the substrate surface, in which EMI shield edges remain in conductive contact with the grounding means, thereby substantially excluding EMI effects of board coupling and air coupling from shielded electronics.

Further objects and advantages of this invention will become apparent from the detailed description, which follows.

SUMMARY OF THE INVENTION

In general, the present invention provides an economical protective shield assembly of a dielectric substrate and an EMI shield, substantially free of the effects of circuit coupling and air coupling while using a reduced set of hardware for securing an EMI shield into place. The use of simply finished angled shield edges adaptably fitted with a substrate having a solder bead ground path, conductive with a grounding means, interacting to solve the problems previously discussed, is unique and has not been heretofore realized. Similarly, the use of simply finished angled or simple unfinished (i.e., rough) angled shield edges adaptably fitted with an improved substrate having an angled mating groove conductive with a grounding means, interacting to solve the problems previously discussed, is unique and has not been heretofore realized.

The invention also provides a simplified solution to the exclusion of EMI effects due to board coupling and air coupling by a fabrication process requiring fewer finish steps than prior art processes. The use of simply finished angled shield edges adaptably and non-precisionly fitted with an improved substrate having an angled mating groove and a ground path conductive with a grounding means, interacting to solve the problems previously discussed, is unique and has not been heretofore realized.

The shield assembly substantially excludes EMI board coupling and air coupling from electronic components, which are shielded by the assembly. The shield assembly also substantially prevents EMI board coupling and air coupling from electronic components emitting EMI signals from within the assembly. The assembly provides a grounding means having a ground along the ground path. The ground path traverses the interface between the shield edge and either the substrate or the intermediary, which is in contact with the substrate, depending on the configuration.

Propagating EMI signals encountering the shield are reflected or absorbed by the grounded EMI shield, which effectively acts as an infinite sink as it is in conductive contact with an infinite sink. The non-reflected energy, also known as absorbed signals, are routed to the sink along each of the shield walls in which the energy is absorbed. Due to the grounded shield (with the ground path), substantially all of the absorbed signals are routed to the ground. Board coupling and air coupling are substantially eliminated as the EMI shield is provided a continuous ground through the intermediary at the interface, and the assembly substantially excludes EMI signal emanating from electric fields, magnetic fields and electro-magnetic radiation.

The assembly is comprised of a dielectric substrate, having at least one component electrically mounted on the surface of the substrate, an EMI shield having contact edges fitted on the substrate, shielding at least one mounted component, and a grounding means electrically grounding the shield. The assembly preferably does not necessitate the precision placement of shield edges with the substrate to the extent of the prior art.

The dielectric substrate provides a mounting base and is functional to provide electric current, via printed circuit patterns, to mounted electronic components. Preferably the substrate is rigid and nearly planar since the securing means is secured into the substrate. The securing means may secure the shield to the substrate in a variety of ways including but not limited to screws being inserted through the back of the substrate into a shield, and/or mounting a pair of shields "back-to-back," one on each side of the substrate. The dielectric substrate may be a printed circuit board (PCB) or a circuit and a base assembly. A location on the substrate, for placing and securing the shield is predetermined, and is referred to herein as the "shield trace".

A grounding means provides electrically conductivity with and along the ground trace. The ground trace is at and along the same predetermined location as the shield trace. The ground trace when conductive with the grounding means shall also be referred to herein as the "ground path". The shield, once attached to the substrate along the ground trace, is electrically grounded to the zero potential of the ground by the ground path through the grounding means. An intermediary is provided along the ground path at designated positions, wherein the intermediary between the interface of the substrate and the shield edge is provided for contact between the shield edge and the ground. Preferably, the intermediary is a material selected from the group of solder, copper or indium.

The EMI shield may first be shaped, by fabrication processes such as casting or forming for instance, and is then positioned at a predetermined location onto the shield trace. The shield is comprised of a material suitable for effectively and substantially reflecting and/or absorbing EMI signals. Edges of the shield are located along the lower portion perimeter of the shield. Edges may be "rough" (i.e., unfinished) without post-fabrication processes to smooth the angular sides of the edges. Edges may also be finished, by using an edging means, which is capable of smoothing the roughness from the edge sides and surfaces. Preferably, the edge is simply and angularly finished.

The contact surface of each edge fittably contacts the substrate, or the intermediary, when the shield is mounted and secured onto the substrate to form the assembly. The contact surface of each edge is fitted on the substrate, along the shield trace, in contact with the intermediary. At the point of contact between the substrate and the shield, through the intermediary along the ground path, an interface is formed.

In accordance with one aspect of the present invention, the dielectric substrate comprises a solder bead on the surface of the substrate, above the horizontal axis of the substrate surface, which is functional as a ground path and is electrically conductive with the grounding means, and the EMI shield comprises angled finished edges adapted to be fitted into the solder ground path, such that the assembly is substantially free of the effects of board coupling and air coupling.

In accordance with another aspect of the present invention, the dielectric substrate comprises an angled mating groove for each unfinished shield edge, in which each groove has angled walls and is positioned below the horizontal axis of the substrate surface and has a ground path which is in electrical conductivity with the grounding means, such that the assembly is substantially free of the effects of board coupling and air coupling.

In accordance with another aspect of the present invention, the dielectric substrate comprises an angled mating groove for each finished angled shield edge, in which each groove has angled walls and is positioned below the horizontal axis of the substrate surface, and the EMI shield comprises cooperatively-angled finished edges adaptably fittable into the groove which has a ground path in electrical conductivity with the grounding means, such that the assembly is substantially free of the effects of board coupling and air coupling.

In accordance with a further aspect of the present invention, a method for a simplified fabrication of an assembly, requiring a reduced set of hardware for securing the shield, in which the assembly is substantially free of the effects of board coupling and air coupling, is provided for.

These and other objects, features and advantages of the present invention will become apparent from the following detailed description of illustrative embodiments thereof, which is to be read in connection with accompanying drawings.

BRIEF DESCRIPTION OF THE DRAWINGS

The invention, together with its various features and advantages, can be readily understood from the following more detailed description taken in conjunction with the Figures herein below.

FIG. 1 is a series of cross-sectional views of three aspects of the prior art of present flat-finished EMI shield edges for contact with substrate surfaces.

DETAILED DESCRIPTION OF THE INVENTION

Figure 1A:
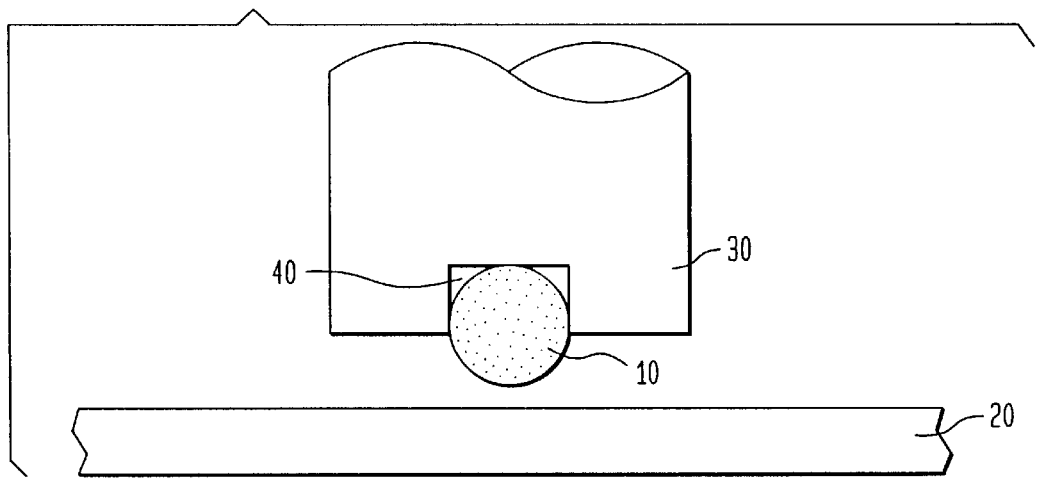
FIG. 1A is a costly aspect of the prior art depicting a conductive gasket to be placed on a substrate and a casted EMI shield having a cut-out on the planar edge surface fitted to receive the gasket.
Figure 1B:
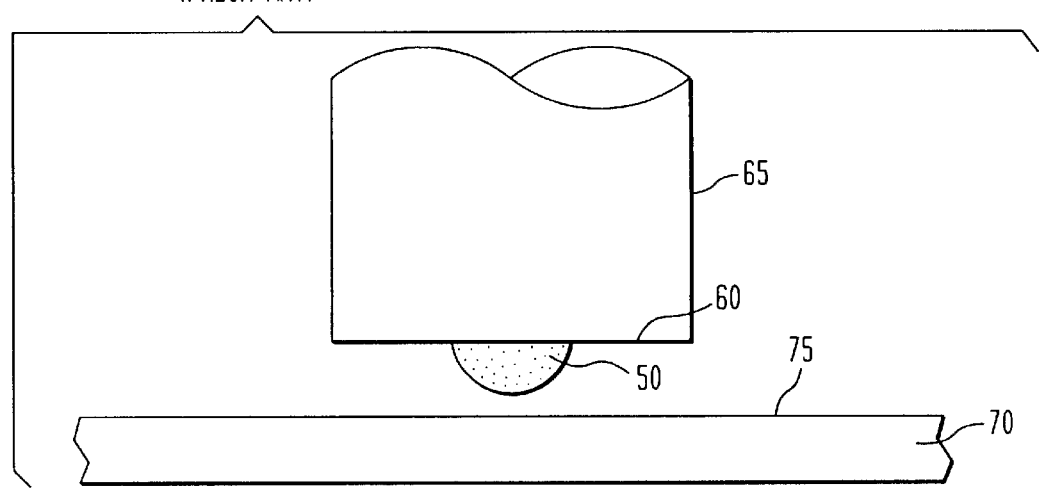
FIG. 1B depicts a gasket, which forms in place on the planar contact surface of the substrate, and is being positioned onto a substrate surface.
Figure 1C:
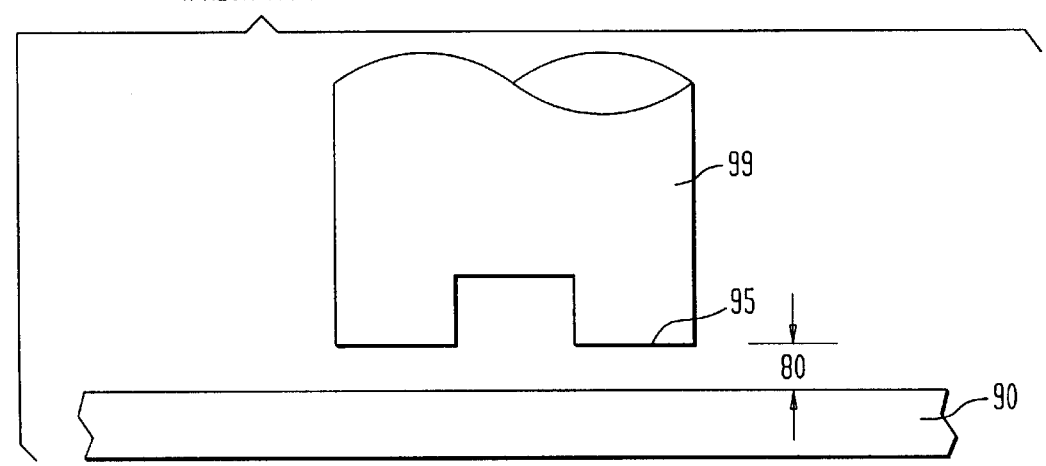
FIG. 1C depicts a non-contacting interface between a substrate and a planar shield edge which provides isolation of certain EMI signals in certain configurations, such as those of a microwave, but which is ineffective in other applications.
Figure 2:
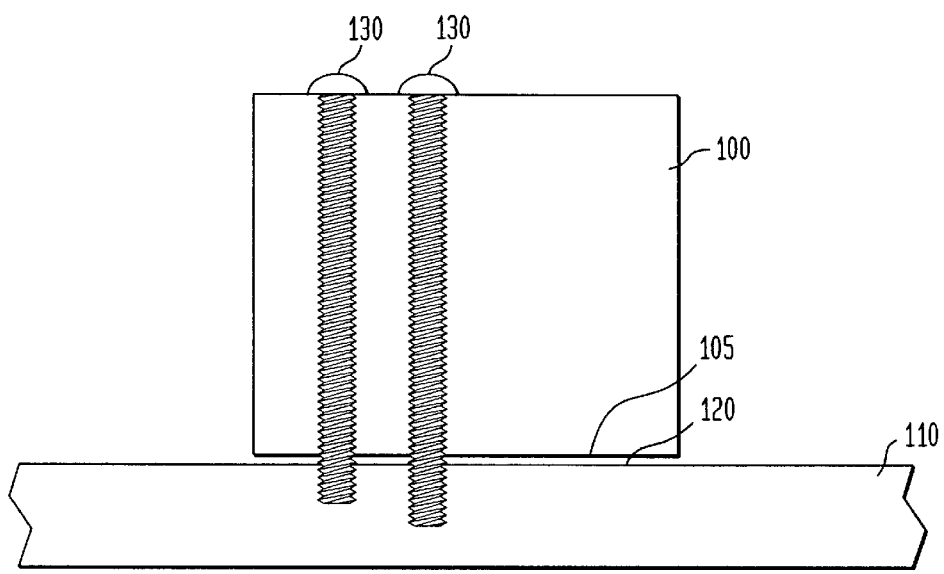
FIG. 2 is a diagrammatic view of the prior art of an EMI shield, having a planar shield edge, mounted and secured to a substrate with screws as the securing means.

The preferred embodiments of the present invention and its advantages are best understood by referring to the drawings, like numerals being used for like and corresponding parts of the various drawings.

Figure 3:
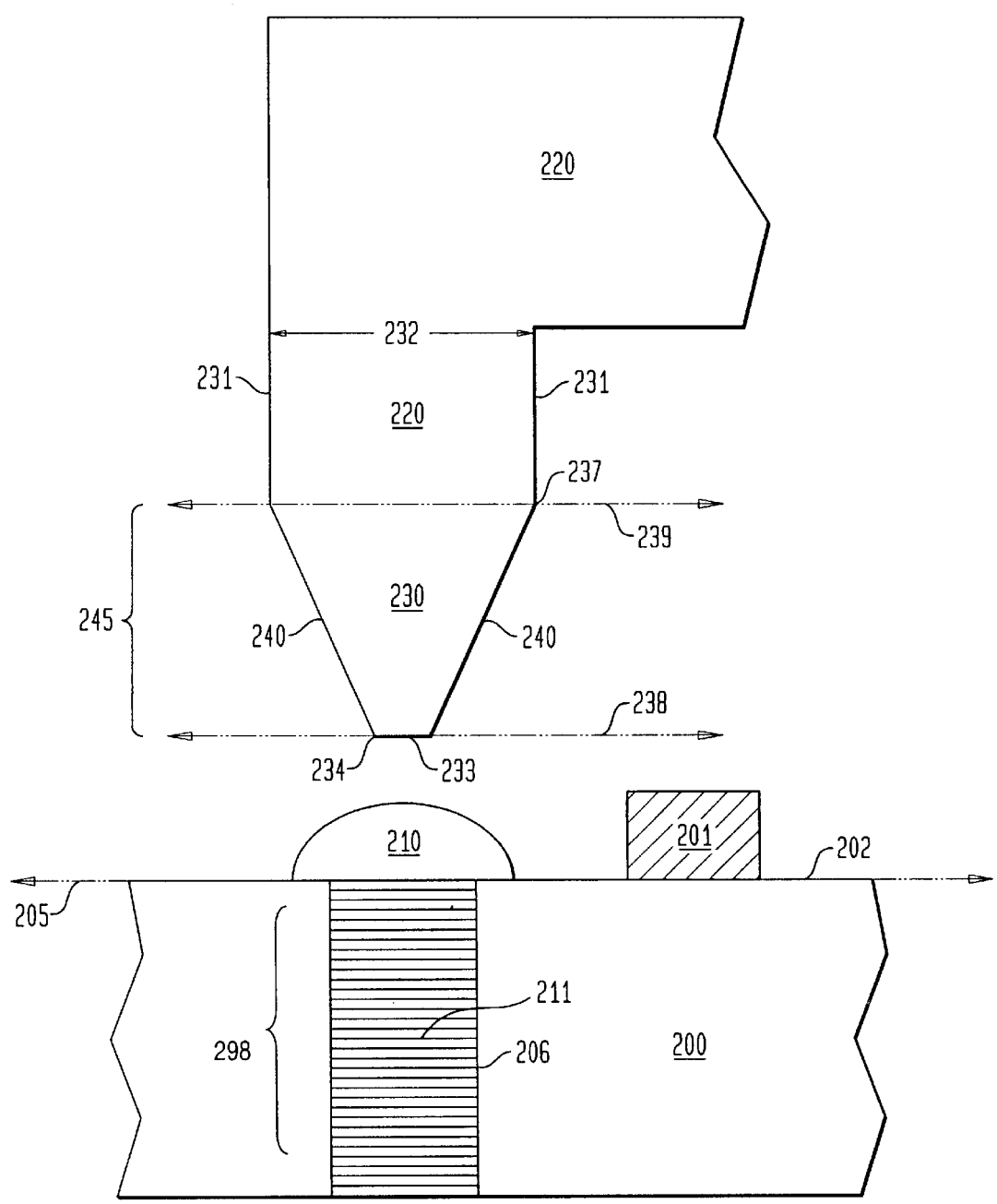
FIG. 3 is a cross-sectional view of a preferred embodiment of the present invention in which the substrate comprises a solder bead as an intermediary in electrical conductivity with the grounding means and the EMI shield comprises finished angled edges adapted to be fitted into the intermediary to form a continuous grounded interface. The grounding means is comprised of a plurality of vias through the substrate along the ground path, in which each via preferably is filled with solder.

FIG. 3 is a cross-sectional view of a preferred embodiment of the present invention in which the substrate 200 comprises a solder bead intermediary as a ground path 210 in electrical conductivity with the grounding means 298, functional as a ground path 210, and the EMI shield 220 comprises opposing, finished angled edge walls 240 along the shield edge 230 adaptably fittable into the intermediary 210. Preferably, the intermediary 210 is solder. The substrate 200 has at least one electronic component 201 electrically mounted onto the substrate surface 202, and the shield 220, when completed and in contact with the substrate 200, is positioned over or in proximity to the component 201 which is to be shielded. A component 201 in all aspects of the invention may be shielded to substantially prevent EMI signals from interfering with the component 201, or may be shielded to substantially prevent EMI signals from being emitted by the component 201 from the shielded area.

The substrate 200 is preferably a dielectric, such as a circuit board 200 which may be a single layer board with a supportive base or a multi-layer board having two or more layers. A solder bump or bead 210 is the grounding means providing electrical connectivity with the circuit ground by vias 206 which penetrate the substrate 200 and are preferably filled with solder 211. The vias 205 are spaced at predetermined intervals along the ground path. The vias 206 preferably have diameters of approximately 0.005 to 0.030 inches. The solder bump 210 provides electrical grounding connectivity along the ground path. Preferably the solder bump 210 is at least 1/16 inches in diameter or in height above the substrate surface 202. The height of the solder bump 210 is preferably 1/10 of an inch and typically ranges from nearly 0.010 inches to approximately 0.1 inches, depending on the size of the assembly, to ensure contact along the contact surface of the edge 233, which is also referred to as the edge base 233. Neither the substrate 200, the edges 230 nor the edge bases 233 for the present invention are required to be precisely planar as the invention accounts for non-planar irregularities.

The EMI shield 220 may be fabricated or casted, and is preferably comprised of materials, which substantially reflect and/or absorb EMI signals. Materials which are known to substantially reflect and/or absorb EMI signals include sheet metal, magnesium, pot-metal, aluminum and aluminum-alloys, by way of example and not of limitation. The shield 220 is comprised of two opposing shield edge sides 231, which are separated by a shield edge width 232 and which are perpendicular to the horizontal axis 205 of the substrate 200, and a base 233, which is preferably nearly planar, is at the proximal end 234 of the edge 230 and is parallel to the horizontal axis 205. The edge 230 is angularly shaped by an edging means (not pictured) to form two opposing angled sides 240 such that the length of the base 233 is in relation to the angle of the angled sides 240. Preferably, the base 233 length is of a value always greater than zero, but which may closely approximate zero. Preferably the distance 245 between a first-axis plane 238, parallel with and along the horizontal axis of the base 233, and a second plane 239 parallel with and along the horizontal axis of the distal end of the edge 237, in which the sides 231 begin to angle towards one another, is of a value less than the length of the angled side 240, hereinafter known as the "plane distance" 245.

The angled sides 240 are formed using an edging means. Preferably, the edging means is a sharp blade, or knife, which is used to form the desired angles and approximate the base 233 to the shape of a point. The shield 220 is compressed onto the substrate 200 and the angled edge 230 penetrates the solder bump 210 since the material of the edge 230 is stronger than solder 210. Due to the angles of the edge sides 240 and the size of the edge base 233, the edge 230 is able to sufficiently penetrate the solder bump 210 and thereby provide a ground to the edge 230 through the intermediary solder 210. The intermediary 210 also provides contact between the edge 230 and the substrate 220, which may be non-planar surfaces due to fabrication processes. A securing means, such as screws (not pictured), secures the shield in place on the substrate. For the present invention, the securing means requires less hardware than the prior art due to the improved and ground contact, and thereby reduces the cost and time required to complete.

Substantially excluding EMI effects through board coupling and air coupling are provided for since there is a ground path along the surface 202 of the substrate. Effectively, the ground provides a stable potential across the grounded elements. EMI signals received at the shield 220 are therefore either reflected or absorbed and grounded, thereby the component 201 is substantially free of EMI effects. Similarly, EMI signals transmitted from a shielded component 201 are reflected within the shield 200 and the signals which are absorbed are grounded, thereby effectively prevent the transmission of EMI from an emitting component 201.

Figure 4:
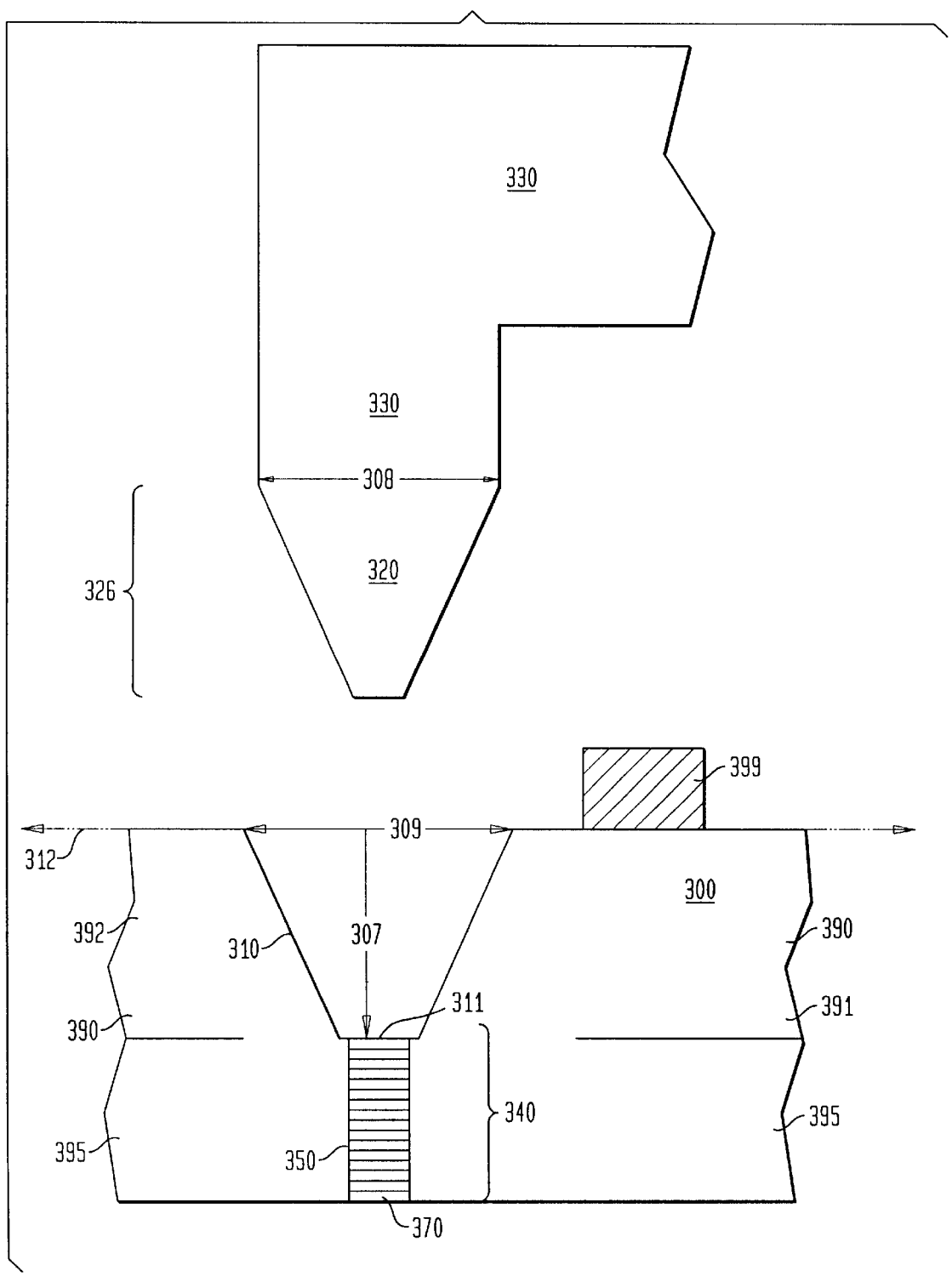
FIG. 4 is a cross-sectional view of a preferred embodiment of the present invention in which the substrate has an angled mating groove with angularly shaped walls to adaptably fit a simply finished angular edge of an EMI shield which is grounded with the grounding means through an intermediary of solder. The grounding means is comprised of a plurality of vias through the substrate along the ground path, in which each via is preferably filled with solder.

FIG. 4 is a cross-sectional view of a preferred embodiment of the present invention in which the substrate 300 has an angled mating groove 310 cooperatively shaped to receive and fit a simply finished angled edge 320 of an EMI shield 330, and in which the grounding means 340 is comprised of a plurality of vias 350 through the substrate 300, filled with solder 370. Alternatively, the angled edge 320 may be an unfinished angled edge, which typically results due to standard fabrication or casting processes of shields. Features and preferred embodiments of FIG. 3, including the substrate 300, the angled edge 320, the shield 330, the plane distance 326 and the vias 350, have been previously discussed and are herein incorporated by reference in this embodiment.

The substrate 300 further comprises an angled mating groove 310 shaped to cooperatively receive the finished or unfinished angled shield edge 320. Preferably, the groove 310 is of a width 309 slightly greater than the width 308 of a shield edge and is of a depth 307 slightly greater than plane distance 326. Along the base plane 311 of the groove 310, perpendicular to the horizontal axis 312, a plurality of vias 350 penetrate the substrate 300. The vias 350 are filled with solder 370 and provide a ground contact through a ground path. Preferably the vias 350 have copper within their annular wall regions and are filled with solder.

The substrate 300 is preferably a multi-layer substrate or a single layer substrate having a rigid support base. In a multi-layer substrate 300, each side 391, 392 of the upper portion of the substrate 390 is effectively separated by the presence of the mating groove 310, and is therefore electrically isolated from electrical connectivity across the circuit board. The lower portion of the substrate 395 may remain conductive without interfering with the operation of the component 399.

Since the groove 310 physically and electrically isolates the upper layer, board coupling is substantially prevented. Similarly, due to the contact of the shield edge 320 with the ground path, as described previously, both board and air coupling are substantially excluded, as well as the coupling of waves through the board substrate. Alternatively, the groove may be deep enough to segment the substrate into physically separate portions or sections.

Figure 5:
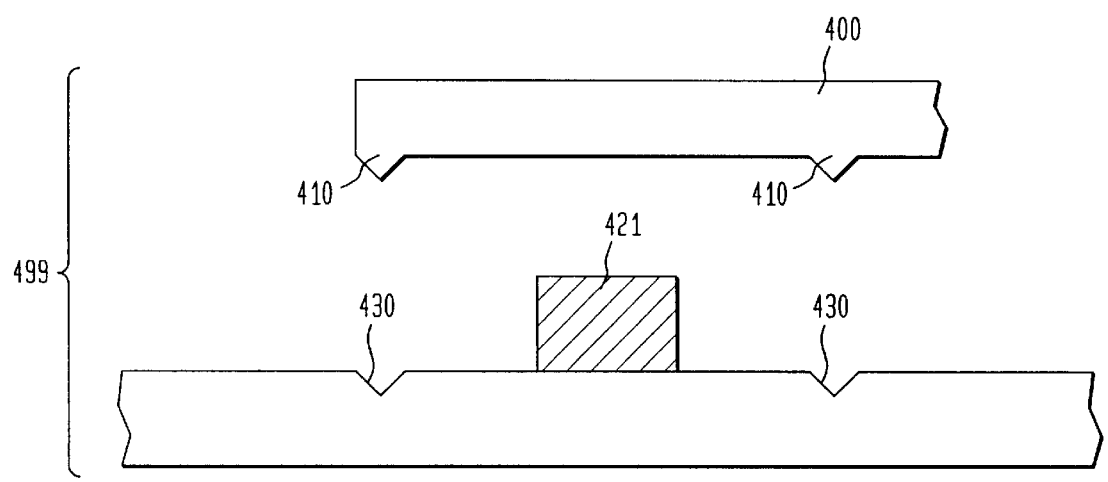
FIG. 5 is a cross-sectional view of an EMI shield, having a plurality of angled edges, being positioned and placed on a substrate having a plurality of angled mating grooves which are cooperatively located in relation to each shield edge and are grounded through an intermediary. The grounding means is comprised of a plurality of vias through the substrate along the ground path, in which each via is filled with solder.

FIG. 5 is a cross-sectional view of an EMI shield 400 having a plurality of angled edges 410, to be placed on a substrate 420 having a component 421 and a plurality of mating grooves 430 which are cooperatively located in relation to each shield edge 410. The shield 400 is readily positioned on the substrate 420 and the need to precisely align the shield edge 410 and the groove 430 is not necessary since the edge 410 and groove 430 are cooperatively shaped and mated. Once positioned, the assembly, 499 may be secured by a securing means (not pictured).

Edges and grooves are cooperatively shaped or angled for the present invention. It is conceivable to cooperatively adapt and shape a groove to receive a shield edge, insert a finished or unfinished shield edge into a shaped groove, and/or to adaptably and cooperatively shape the shield edge and the groove with respect to one another. Modifications to the present invention, such as these, are within the scope of the invention.

The invention resides at least in part in the unexpected realization by the inventors, despite past thinking of the prior art, that EMI effects due to both board coupling and air coupling may be substantially excluded by a simple EMI shield assembly which does not require the precision fitting of an EMI shield and a dielectric substrate. The invention further resides in part in the unexpected realization by the inventors that an economical and simplified fabrication process may be used to produce an EMI shield assembly requiring less securing hardware which is able to substantially exclude EMI effects due to both board coupling and air coupling.

The invention has been described with respect to the aforementioned preferred embodiment. Modifications obvious to the ordinary skilled artisan are intended to be within the scope of the invention, and it will be clear to those artisans that many modifications can be made therein without departing from the spirit and scope of the invention.

What claimed is:

1. A protective shield assembly comprising a dielectric substrate having at least one electronic component electrically mounted on a surface of the substrate, an electromagnetic interference (EMI) shield shielding at least one component and having angled contact edges fitted on a conductive intermediary, and a grounding means which electrically grounds the shield, wherein the assembly substantially excludes EMI signals from traversing the shield assembly) due to board coupling, air coupling and coupling through the substrate.

2. The assembly of claim 1, wherein the intermediary is securably positioned on the substrate at an interface, in which the intermediary electrically interconnects each contact edge to the grounding means along each interface.

3. The assembly of claim 2, wherein the interface is above or below a horizontal axis at the surface of the substrate.

4. The assembly of claim 3, wherein the interface is above the horizontal axis.

5. The assembly of claim 4, wherein the intermediary is a path along a predetermined trace on the substrate surface which is electrically conductive and interconnected to the grounding means and is one of the group of solder, copper and indium.

6. The assembly of claim 5, wherein the intermediary is a solder path.

7. The assembly of claim 6, wherein each angled contact edge comprises two opposing edge sides, in which each side is adaptably and angularly shaped by an edging means such that neither side intersects with the other, each side angularly traverses towards the other, and each side is at an angle less than ninety-degrees from a perpendicular to the horizontal axis; and a contact base which is at a proximal end of the angled contact edge in relation to and parallel with the horizontal axis, wherein the contact base has a width greater than zero.

8. The assembly of claim 7, wherein the edging means is a sharpened blade.

9. The assembly of claim 3, wherein the interface is below the horizontal axis.

10. The assembly of claim 9, wherein the intermediary is a path, electrically conductive and interconnected to the grounding means and adaptably traced along a groove base of an angled mating groove which has opposing angled walls angularly traversing towards each other from the substrate surface to the groove base at an angle less than ninety-degrees from a perpendicular to the horizontal axis, in which the groove base is below the horizontal axis, wherein the intermediary is one of the group of solder, copper and indium.

11. The assembly of claim 10, wherein the intermediary is a solder path.

12. The assembly of claim 10, wherein each groove is adaptably shaped to be fittably mated with each contact edge.

13. The assembly of claim 12, wherein each angled contact edge comprises two opposing edge sides, in which each side is adaptably and angularly shaped by an edging means such that neither side intersects with the other, each side angularly traverses towards the other, and each side is at an angle less than ninety-degrees from a perpendicular to the horizontal axis; and a contact base which is at a proximal end of the angled contact edge in relation to and parallel with the horizontal axis, wherein the contact base has a width greater than zero.

14. The assembly of claim 13, wherein the edging means is a sharpened blade.

15. The assembly of claim 13, wherein the edge and the groove are cooperatively and adaptably shaped for mating.

16. The assembly of claim 13, wherein the two angled walls intersect each other at the groove base.

17. The assembly of claim 10, wherein the groove is adaptably dimensioned to substantially prevent EMI signals from traversing the shield assembly due to board coupling, air coupling and coupling through the substrate.

18. The assembly of claim 17 wherein the groove is devoid of a groove base and is of a depth greater than the thickness of the substrate such that the substrate is physically segmented by the groove.

19. The assembly of claim 1, wherein the grounding means comprises a plurality of vias through the substrate along a predetermined path, wherein each via is electrically interconnected with the grounding means and the intermediary.

20. The method of fabricating a protective shield assembly having a dielectric substrate with at least one electronic component electrically mounted on a surface of the substrate, an electromagnetic interference (EMI) shield shielding at least one component which has angled contact edges having opposing sides and a contact base, fitted on the substrate and a grounding means which electrically grounds the shield, wherein the assembly substantially excludes EMI signals due to board coupling, air coupling and coupling through the substrate, comprising the steps of:

(a) adaptably and angularly edging, by an edging means, each opposing side of an angled contact edge such that neither side intersects with the other, each side angularly traverses towards the other and each side is at an angle less than ninety-degrees from a perpendicular to the horizontal axis at the surface of the substrate, such that the contact base, which is at a proximal end of the angled contact edge in relation to and parallel with the horizontal axis, has a width greater than zero;

(b) adaptably forming an angled mating groove, below the horizontal axis, having opposing angled walls, each wall angularly traversing towards the other from the substrate surface to a groove base at an angle less than ninety-degrees from a perpendicular to the horizontal axis, in which the groove base is below the horizontal axis, wherein the groove is formed to cooperatively receive and adaptably fit the angled contact edge;

(c) tracing a conductive intermediary on and along the groove base in which the intermediary is electrically conductive and interconnected with the grounding means; and (d) securably positioning the angled contact edge into the intermediary.

21. The method of claim 20, wherein the edging means is forming by a sharpened blade.

22. The method of claim 20, wherein the method further comprises securing the shield into the intermediary with a securing means.

23. The method of claim 22, wherein the securing means comprises mounting by a plurality of screws.

24. The method of claim 22, wherein the intermediary is a solder path.

25. The method of claim 20 in which the intermediary is one of the group of solder, copper and indium.

26. The method of claim 24 wherein the groove is adaptably formed to be devoid of a groove base and is of a depth greater than the thickness of the substrate to physically segment the substrate into sections.

* * * * *